United States Patent [19]
Ghoshal

[11] Patent Number: 6,000,225
[45] Date of Patent: Dec. 14, 1999

[54] TWO DIMENSIONAL THERMOELECTRIC COOLER CONFIGURATION

[75] Inventor: Uttam Shyamalindu Ghoshal, Austin, Tex.

[73] Assignee: International Business Machines Corporation, Armonk, N.Y.

[21] Appl. No.: 09/067,148

[22] Filed: Apr. 27, 1998

[51] Int. Cl.$^6$ .................................................... F25B 21/02
[52] U.S. Cl. .............................................. 62/3.7; 62/335
[58] Field of Search ................................. 62/3.2, 3.7, 3.3, 62/335; 136/208, 203, 204, 228, 225

[56] References Cited

U.S. PATENT DOCUMENTS

| | | | |
|---|---|---|---|
| 3,159,979 | 12/1964 | Anders | 62/3.7 |
| 3,879,229 | 4/1975 | Gilbert | 136/208 |
| 4,095,998 | 6/1978 | Hanson | 136/208 |
| 4,362,023 | 12/1982 | Falco | 62/3.2 |
| 4,453,385 | 6/1984 | May | 62/3.62 |
| 4,463,569 | 8/1984 | McLarty | 62/3.2 |
| 4,673,863 | 6/1987 | Swarbrick | 136/208 |
| 5,361,587 | 11/1994 | Hoffman | 62/3.2 |
| 5,385,022 | 1/1995 | Kornblit | 62/3.2 |
| 5,448,891 | 9/1995 | Nakagiri et al. | 62/3.4 |
| 5,465,578 | 11/1995 | Barben et al. | 62/3.2 |
| 5,605,048 | 2/1997 | Kozlov et al. | 62/3.7 |

OTHER PUBLICATIONS

Gerald Mahan et al., "Thermoelectric Materials: New Approaches To An Old Problem," American Institute of Physics, Physics Today, pp. 42–47, Mar. 1997.

Boris Moyzhes, "Possible Ways for Efficiency Improvement Of Thermoelectric Materials," IEEE 15th International Conference on Thermoelectrics, pp. 183–187, 1996.

L.D. Hicks et al., "Experimental Study of the Effect of Quantum–Well Structures on the Thermoelectric Figure of Merit," IEEE 15th International Conference on Thermoelectrics, pp. 450–453, 1996.

*Primary Examiner*—William Doerrler
*Attorney, Agent, or Firm*—Casimer K. Salys; Jack V. Musgrove; Andrew J. Dillon

[57] ABSTRACT

A system for efficiently transferring heat from a cold sink to a hot source utilizing thermoelectric cooling effects is disclosed. A plurality of thermoelectric elements are coupled in a series configuration with a power source. The plurality of thermoelectric elements are coupled in a parallel configuration with the cold sink and the hot source. The surface area of the hot source is greater than the surface area of the cold sink such that the plurality of thermoelectric elements can effectively transfer heat from the cold sink to the hot source in response to the power source. The plurality of thermoelectric can be fabricated on an integrated circuit with analog or digital circuity and effectively cool hot spots.

21 Claims, 5 Drawing Sheets

TWO DIMENSIONAL THERMOELECTRIC COOLER CONFIGURATION

CROSS-REFERENCE TO RELATED APPLICATIONS

The present application is related to co-pending U.S. patent application Ser. No. 08/988,621 (IBM Docket No. AT9-97-707) filed Dec. 10, 1997, U.S. patent application Ser. No. 08/988,429 (IBM Docket No. AT9-97-710) filed Dec. 10, 1997 and U.S. patent application Ser. No. 09/078,705 (IBM Docket No. AT9-98-007) filed May 14, 1998. All above-mentioned applications are assigned to the assignee of the present application.

BACKGROUND OF THE INVENTION

1. Technical Field

The present invention relates in general to thermoelectric cooling, and in particular to a system for positional cooling utilizing thermoelectric devices. Still more particularly, the present invention relates to a system for positional cooling utilizing a novel configuration of Peltier devices.

2. Description of the Related Art

The utilization of thermoelectric devices in industry has, to date, been restricted to very specialized applications. Due to inefficiencies, very few applications can effectively utilize thermoelectric effects. The undesirable properties of thermoelectric elements such as high cost and low efficiency are outweighed by the desirable properties of thermoelectric devices. Recently, there have been significant advances in material technology, many attributable to advances made by the semiconductor industry.

Conventional cooling systems, such as a refrigerator, utilize vapor compression refrigeration cycles to provide heat transfer. Vapor compression cooling requires significant moving hardware, including at a minimum, a compressor, a condenser, an evaporator, and related coolant transfer plumbing. Miniature vapor compression cooling is not available for small cooling applications.

Semiconductors and superconductors have enhanced performance at lower temperatures. CMOS logic can operate materially faster at lower temperatures. For example, if CMOS logic devices are operated at −50° C., performance is improved by 50 percent over ambient room temperature. Liquid nitrogen cooling of CMOS logic to −−196° C., has shown a 200 percent performance improvement in speed.

Similar benefits have been shown for integrated circuit wiring. Wiring resistances decrease by a factor of two for integrated circuits operated at −50° C. in comparison to room ambient temperature operation.

Thus, sub-ambient temperature operation of integrated circuit logic devices, such as field effect transistors, as well as the interconnect wiring can materially improve integrated circuit performance. However, accomplishing such cooling in the confines of an ever decreasing size poses new challenges.

Thermoelectric cooling is one alternative that has found some usage given the compact size of Peltier devices. Peltier device thermoelectric cooling is very reliable because such devices are solid state. The inefficiency of thermoelectric devices is a key negative aspect of implementing a thermoelectric cooling design. A Peltier device cooling system typically has an efficiency in the range of 20 percent for a relatively nominal temperature differential between the cold sink and ambient temperature conditions.

For example, utilizing a Peltier cooling system to cool at a rate of one watt and attain a sub-ambient temperature of 0° C. requires that the system be powered with five watts. As the amount of heat to be transferred increases, the total power to be dissipated into the ambient mandates large convection devices and large power supply circuits. Therefore, Peltier device thermoelectric cooling has not been considered a broadly applicable technology for cooling integrated circuits and improving integrated circuit performance.

Typically, Peltier devices are fabricated from semiconductor material such as bismuth telluride or lead telluride. Commonly utilized, Peltier materials exhibit very high electrical conductivity and relatively low thermal conductivity. In contrast, most metals have both high electrical and high thermal conductivity.

In operation, a Peltier device transports electrons from a cold sink at temperature $T_{cold}$ to a hot source at temperature $T_{hot}$ in response to an electric field placed across the Peltier device.

FIG. 1 schematically depicts a conventional Peltier type thermoelectric element (TE) 1 with DC power supply 2 creating an electric field across TE 1 and a load current 3. The desired heat transfer is from cold sink 16 at temperature $T_{cold}$ to hot source 14 at temperature $T_{hot}$ which is represented below.

$$q = \alpha T_{cold} I - \tfrac{1}{2} I^2 R - K \Delta T \qquad \text{Equation 1}$$

The net heat energy transported by a Peltier device is composed of three elements. In equation 1, the first element represents the Peltier effect (thermoelectric) contribution, the second element defines negative Joule heating or resistive effects, and the third element defines negative conductivity effects of the heat. The thermoelectric component is composed of the Seebeck coefficient, the temperature of operation ($T_{cold}$) and the current through the (TE) device.

Approximately one half of the Joule heating produced by the bias current is conducted to the cold sink and the remainder to the hot source. Lastly, the negative component attributable to thermal conduction represents the heat flow or heat conduction through the Peltier device. K is the thermal conductivity of the Peltier device from the hot source to the cold sink.

In equation 1, the thermoelectric component of the heat transport increases linearly with the current through the Peltier device and the Joule heating increases in proportion to the square of the current. Alternately described, the resistive heating exponentially increases due to the current through the Peltier device while the cooling effect linearly increases with increased current flow. The thermal conduction is also in direct proportion to the temperature differential between the hot source and the cold sink. Equation 1 clearly reflects how quickly the Peltier device becomes inefficient.

Equation 2 below defines a coefficient of performance for a Peltier device. The coefficient of performance is the ratio of the net heat energy transported at low temperature to the power consumed in the Peltier device. For a typical Peltier device made from bismuth telluride material, the coefficient of performance is less than 0.3.

$$\eta = \frac{\text{heat transport}}{\text{power consumption}} = \frac{\alpha T_{cold} I - 1/2 I^2 R - K \Delta T}{I^2 R + \alpha I \Delta T} \qquad \text{Equation 2}$$

Note that the numerator of equation 2 represents the net cooling capability of the Peltier device. The denominator of equation 2 represents the total energy provided by external D.C. power supply 2. The individual elements of the numerator were described in reference to equation 1. The first element in the denominator is the total Joule heating, while the second element is the heat energy transport work done by the Peltier device in moving energy from the $T_{cold}$ sink to the $T_{hot}$ source. Based upon this relationship, the maximum coefficient of performance possible in the configuration of FIG. 1 is given by equation 3.

$$\eta_{max} = \frac{T_{cold}}{\Delta T} \frac{\gamma - \frac{T_{hot}}{T_{cold}}}{\gamma + 1} \qquad \text{Equation 3}$$

The parameter $\gamma$ can be expressed in terms of the Seebeck coefficient $\alpha$, electrical conductivity $\sigma$ and thermal conductivity $\lambda$ as set forth in equation 4.

$$\gamma = 1 + \frac{\gamma^2}{RK} T_{hot} + \frac{T_{cold}}{2} = 1 + \frac{\alpha^2 \sigma}{\lambda} \overline{T} = 1 + Z\overline{T} \qquad \text{Equation 4}$$

The first factor in equation 3 $T_{cold}/\Delta T$ is the maximum efficiency possible for any heat pump operating between two thermal sinks $T_{cold}$ and $T_{hot}$. $T_{cold}/\Delta T$ is commonly referred to as the Carnot efficiency. The second factor represents the non-ideal thermoelectric cooling, which can also be characterized by a figure of merit $Z\overline{T}$. Note that $\eta \rightarrow (T_{cold}/\Delta T)$ as $\gamma \rightarrow \infty$. To date it has been very difficult to develop a thermoelectric material which yields high values of $Z\overline{T}$.

Historically, the prevalent material for thermoelectric coolers has been bismuth telluride ($Bi_2Te_3$) and lead tellurium (PbTe). These materials have $Z\overline{T}$ values of approximately 0.3 at room temperature. Recent research has shown that $Z\overline{T}$ values approaching one may be possible in lead tellurium quantum wells and multilattices. However, even with these materials, thermoelectric device have not produced practical cooling solutions.

Another constraint of Peltier device cooling is that only a limited temperature excursion below ambient temperature is attainable. The temperature differential limitation arises from the fact that the effective temperature span is constrained by efficiency. Efficiency degrades quickly with an increasing temperature differential between a hot source and a cold sink. The maximum temperature differential possible $T_{max}$ is given by equation 5 below.
Equation 5

$$\Delta T_{max} = \frac{1}{2} Z T_{cold}^2$$

For bismuth telluride having a $Z\overline{T}$ of approximately 0.3, $T_{max}$ is 45° K at 300° K, where 32° f is equivalent to 273K.

Thus, there are a number of very fundamental constraints on efficiency and differential temperature that limit the practical utilization of conventional thermoelectric elements for cooling applications. Particularly, applications which utilize ambient temperatures to dissipate the heat are impracticable. Typically, each Peltier device is small in dimension and can only transport a finite amount of heat. Therefore, to produce a cooling effect of desired magnitude many Peltier devices must be connected together. Peltier cooling has been attempted by attaching TE devices to the top of an integrated circuit package to provide localized cooling. However, the inefficiency of TEs and thermal impedance between the integrated circuit and the TEs has prevented utilization on a large scale.

Within an operational integrated circuit, many subcircuits such as oscillators are actively switching states. During the transition of a transistor from ON to OFF or from OFF to ON the voltage across the transistor and the current through a transistor produces heat from the resistive effects. A circuit that continually switches, creates a "hot spot" in a geographic area on an integrated circuit.

Often, hot spots on the integrated circuit must be located away from other temperature sensitive circuits to ensure proper operation. Integrated circuit spot cooling utilizing Peltier devices has been proposed where Peltier devices are placed on top of the integrated circuit creating a three dimensional configuration. However, a specific problem encountered in integrated circuit cooling is that only a finite amount of Peltier devices can be located in the proximity of a hot spot. Therefore, the amount of heat which can be transferred from the hot spot is very limited.

The dimension of integrated circuit transistors is continually decreasing and the density of transistors is ever increasing. Faster switching speeds or more switching transitions per unit time also contributes to additional heating. Currently, switching speeds of over one gigahertz are being implemented and adequate cooling has increasing importance in such devices.

Analog circuits, such as voltage controlled oscillators, phase detectors, mixers, and low noise amplifiers produce more heat than digital circuits. Additionally, lasers and photo diodes have remarkably improved performance at lower temperatures. Hot spots within an integrated circuit can cause a host of related failures. As the dimension of integrated circuits decrease and become more compact, the dissipation of internally generated heat becomes an increasing problem.

It should therefore be apparent that there is a need for a miniature devices to reduce temperatures of electronic devices within integrated circuit. Further, a novel configuration of Peltier devices for cooling articles external to an integrated circuit would be very desirable.

SUMMARY OF THE INVENTION

It is therefore one object of the present invention to provide an improved method and system for thermoelectric cooling.

It is another object of the present invention to provide an improved method and system for positional cooling utilizing thermoelectric devices.

It is yet another object of the present invention to provide a system for positional cooling within an integrated circuit utilizing a novel configuration of Peltier devices.

The foregoing objects are achieved as is now described. A system for efficiently transferring heat from a cold sink to a hot source utilizing thermoelectric cooling effects is provided. A plurality of thermoelectric elements are coupled in a series configuration with a power source. The plurality of thermoelectric elements are coupled in a parallel configuration with the cold sink and the hot source. The surface area of the hot source is greater than the surface area of the cold sink such that the plurality of thermoelectric elements can effectively transfer heat from the cold sink to the hot source in response to the power source. The plurality of thermoelectric can be fabricated on an integrated circuit with analog or digital circuity and effectively cool hot spots.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

Figure 1:
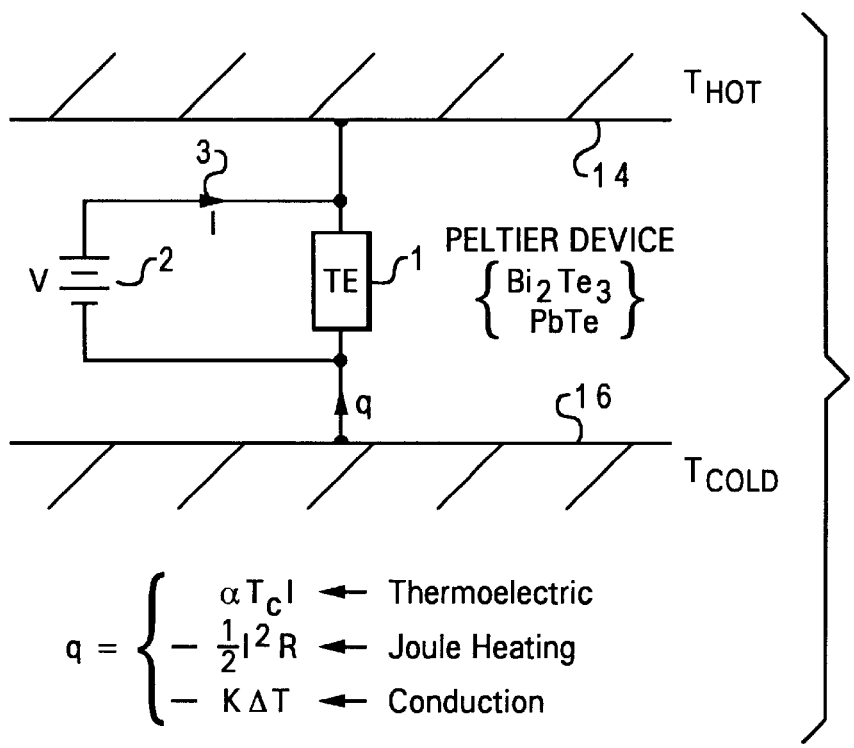
FIG. 1 schematically depicts a conventional statically operable thermoelectric cooling system.
Figure 2:
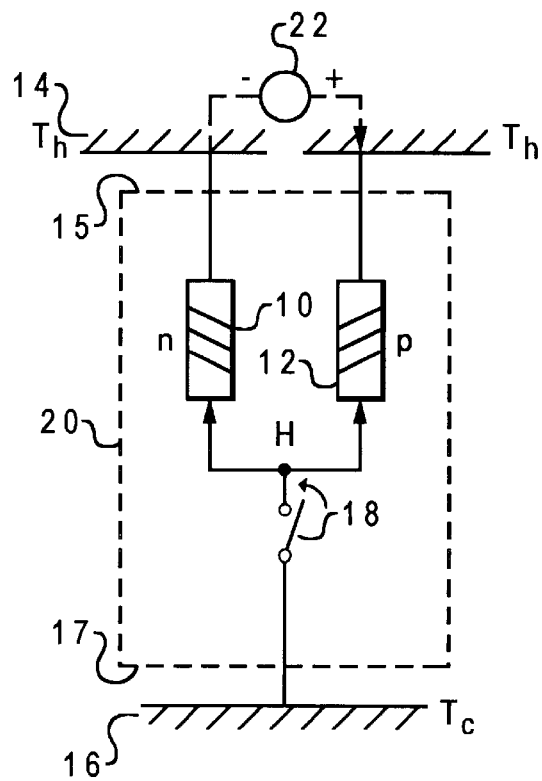
FIG. 2 illustrates a new and novel method for interconnecting a thermoelectric cooler to a cold sink, a heat sink, and a power source.

With reference now to the figures and in particular with reference to FIG. 2, there is depicted a novel interconnection of two thermoelectric cooling devices in accordance with the present invention. The thermoelectric cooling devices depicted are commonly referred to as a Peltier device. A Peltier device is made from two dissimilar materials which produce heat transfer when an electrical current is passed between them. The heat transfer of Peltier devices can be utilized for cooling a cold sink 16.

In selecting Peltier materials to maximize the Peltier cooling effects the fermi-level differences of the thermocouple components must be maximized. This can be accomplished by utilizing semi-conductors having P-N junctions. The Peltier effect does not depend on the nature of the fabrication of the junction between the two materials, which can be soldered, fused, or welded. The Peltier effect relies only on the bulk material properties.

The thermal conductivity of a semiconductor results from mobile carriers and phonon conductivity. Phonon conductivity in a lattice structure is due to changes in force which atomic planes exert on neighboring planes. The lattice force is due to vibrations of the lattice structure about normal lattice sites. Phonon conductivity is relatively unrelated to current flow. Phonon conduction is the same mechanism by which sound is transmitted through a crystal structure.

When a metal and a semiconductor are joined, a barrier exists for the transfer of charge carriers in one direction of current flow. Alternately, an energy drop exists for the transfer of charge carriers in the other direction of current flow. For current leaving a P region, the holes in the P-type semiconductor must give up energy to recombine with electrons from the metal at the junction of the materials. (Energy for holes increases downward).

At the other end of the semiconductor, electrons passing from the semiconductor into the metal must also give up energy. The energy given up results in the heating of the metal. Electrons passing from the metal into the N-type semiconductor must absorb energy. A similar situation exists for holes and recombination cools the metal.

The embodiment in FIG. 2 utilizes two thermoelectric elements, N-type thermoelectric element 10 and P-type thermoelectric element 12, wherein the N-type thermoelectric element has N impurities and the P-type thermoelectric element has P impurities. Alternating N and P elements allows the shared utilization of a single power source.

The mechanism of Peltier heating and cooling is one of heat storage or release by mobile-carrier populations. The Peltier coefficient is the energy carried per unit charge of mobile carriers. During operation, carriers are injected into a region where their energy is significantly different from the average thermal energy of the normal carrier population. Due to a substantial number of carriers and their energy difference, injected carriers change the average energy of a region and therefore the temperature of the region which the injected carriers enter changes.

A temperature difference between opposing surfaces of a material usually results in the flow of thermal energy from the hotter surface to the cooler one.

In FIG. 2, hot source 14 is heated and cold sink 16 is cooled by thermoelectric element 20. Thermoelectric element 20 is comprised of N-type thermoelectric element 10 and P-type thermoelectric element 12. Thermal switch 18 thermally couples cold sink 16 to N-type thermoelectric element 10 and P-type thermoelectric element 12 when thermal switch 18 is closed.

In the illustrated embodiment, thermoelectric element 20 is continuously coupled to hot source 14 at one end 15 through a thermal path having little thermal resistance. Second end 17 of thermoelectric element 20 is thermally coupled through thermal switch 18 to cold sink 16. As embodied in FIG. 2, power source 22 provides a voltage across thermoelectric element 20 which produces an electrical current. A few millivolts across thermoelectric element 20 produces a current on the order of one ampere.

In a preferred embodiment, a current pulse is supplied by power source 22 to thermoelectric element 20; however, a switch can be placed in series with power source 22 and thermoelectric element 20 to provide a pulsed current.

At the start of a cycle, the temperature of thermoelectric element 20 is $T_{hot}$ by virtue of the thermal coupling to hot source 14. Upon current flow, thermoelectric element 20 quickly establishes a relative temperature differential between hot source 14 and cold sink 16 from the Peltier effect. The temperature differential allows heat transfer from cold sink 16 through thermal switch 18 to hot source 14.

Within approximately three milliseconds of the leading edge of the current pulse, Joule heating effects, due to resistance within thermoelectric element 20, elevate the average temperature of thermoelectric element 20 so that the net Peltier heat transfer through thermoelectric element 20 begins to decrease. At the trailing edge of the current pulse, thermal switch 18 is opened, disconnecting the thermal coupling of thermoelectric element 20 to cold sink 16.

The residual thermal energy in thermoelectric element 20 due to Joule heating exponentially decays to hot source 14 after thermal switch 18 disconnection. Joule heating elevates the thermoelectric devices temperature sufficiently above the hot sink temperature and an exponentially decaying heat transfer between thermoelectric element 20 and hot source 14 takes place. When the temperature of thermoelectric element 20 has decayed to a temperature approaching hot source 14, the cycle is repeated.

The transient character of the heat transfer operation acknowledges that thermoelectric heat transfer occurs immediately upon the receipt of a relative voltage whereas Joule heating and subsequent thermoelectric element conduction loss are delayed effects. Thus, the invention relies on the different time scales and time constants of Peltier cooling, resistance heating and thermal conduction.

Figure 3:
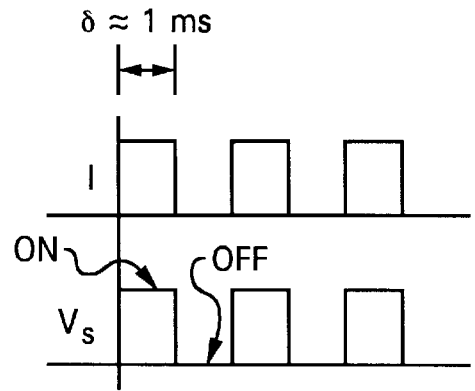
FIG. 3 depicts a basic timing diagram for implementing the switching of the thermoelectric cooler of FIG. 2.

With reference now to FIG. 3, there is depicted a graph of current pulse I and the operation of thermal switch Vs. The synchronization of current pulse I in relationship to the timing of thermal switch 18 is depicted.

Referring back to FIG. 2, thermal switch 18 connects the cold end of thermoelectric element 20 to cold sink 16 when Vs is on. Thermal switch 18 is solely a thermal switch, eliminating any electrical conduction and Joule heating, or resistive losses, associated with a current flow.

Current pulse I and duty cycle of thermal switch Vs provides flexibility in defining switching synchronizations of the present invention. Although current pulse I and the operation of thermal switch Vs both have very short duty cycles, and exhibit relatively synchronous operation to one to another, the pulse width and the timing of the closure and opening cycles are likely to differ depending on the transient characteristics of the thermoelectric elements utilized and the thermal couplings to hot source 14 and cold sink 16.

Summarizing FIG. 2, a current pulse creates instantaneous cooling due to the Peltier effect. The Peltier effect creates heat transfer from cold sink 16 to hot source 14 through closed thermal switch 18. However, before the transfer of heat from Joule heating in the opposite direction of the Peltier effect, thermal switch 18 is opened to prohibit such a transfer. Specifically, thermal switch 18 opens such that the energy from Joule heating is not allowed to transfer from thermoelectric element 20 to cold sink 16.

A basic concept for improving efficiency from prior art designs, is herein described. With reference to thermoelectric element 20 in FIG. 2, a more detail description and variations thereof are more thoroughly described in the co-pending applications referenced in the first paragraph of this application. The description of FIG. 2 should not be considered as limiting the scope of the present invention as many configuration could be utilized in conjunction with the present invention.

Figure 4:
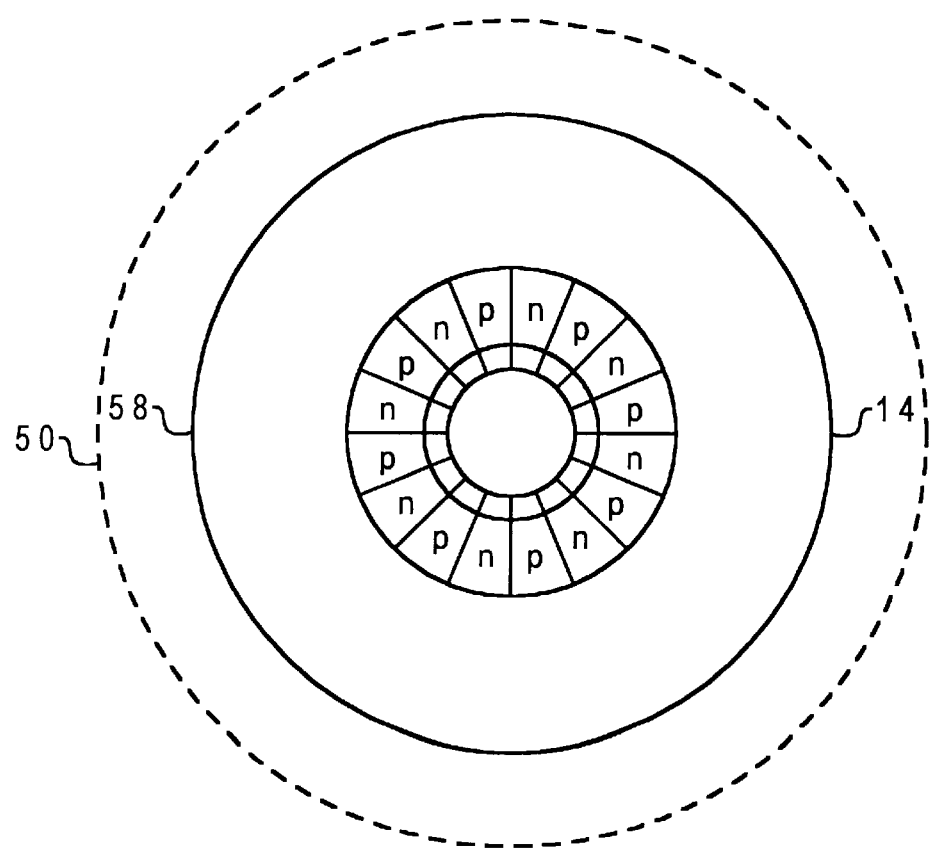
FIG. 4 depicts a novel Peltier device configuration in accordance with the method and system of the present invention.

Referring now to FIG. 4, a novel two dimensional thermoelectric cooling configuration 50 is depicted. P and N thermoelectric devices are placed adjacent to each other in a radial configuration such that cold sink 16, or the area to be cooled, is enclosed by Peltier devices and outer ring 58 dissipates heat into the ambient.

Two dimensional thermoelectric cooling configuration 50 can be fabricated on the same layer of silicon with circuits which require cooling. The thermoelectric cooler pattern can be placed in an integrated circuit on the same substrate as the signal processing circuitry of the integrated circuit. Additionally, the thermoelectric cooler can cool all sides of a temperature critical circuit. Further, the thermoelectric cooler can maintain uniform cooling on all sides of a temperature sensitive circuit.

Figure 5:
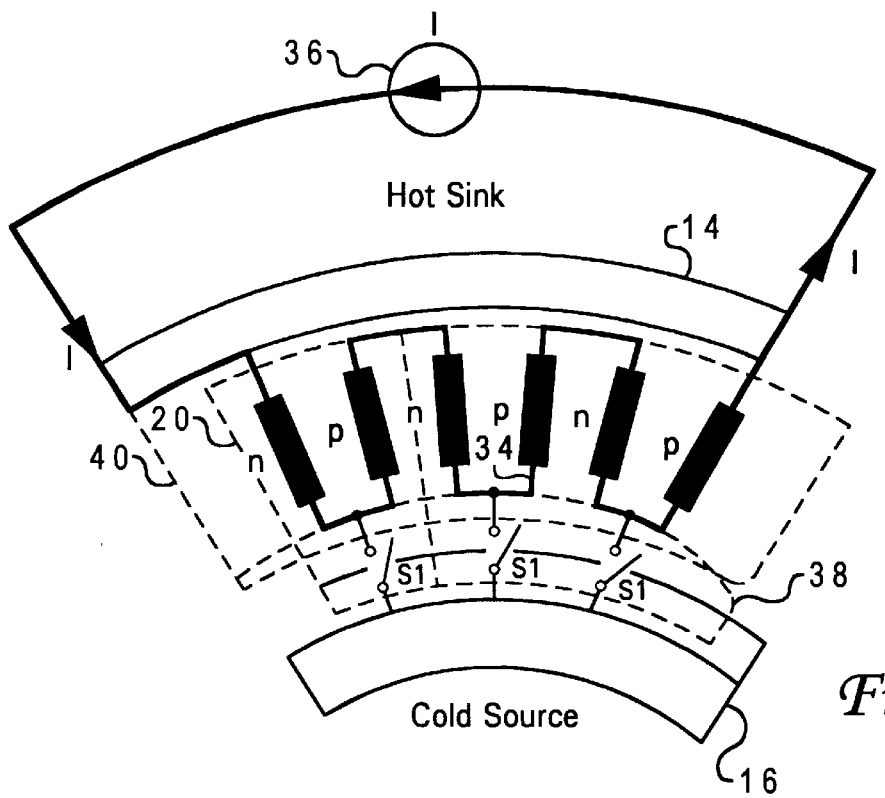
FIG. 5 illustrates a portion of a two dimensional configuration which can be utilized to cool a hot area in an integrated circuit which is generating heat in accordance with the method and system of the present invention.

Referring to FIG. 5, a model schematic of a sub-sector of the radial configuration depicted in FIG. 4 is illustrated. Elements having identical reference numerals in the figures have identical functions. For example, thermoelectric element 20 of FIG. 5 functions as thermoelectric element 20 of FIG. 2. As depicted in FIG. 5, alternating P and N type devices allow a series of electrical connection of thermoelectric devices. A series configuration minimizes interconnection problems and allows the Peltier heat transfer to occur outward from the center of the configuration accommodating the alternating direction of current flow in P and N type devices. Current I flows from the center outward in P type devices and from hot source 14, towards the center in the N type devices while Peltier cooling occurs outward in all devices.

The P and N thermoelectric devices are electrically configured in a series configuration to minimize the lead surface area requirements between cold sink 16 and the P and N thermoelectric devices. A parallel electrical interconnection would required placement of interconnecting leads between cold sink 16 and thermoelectric element 20. Leads within cold sink 16 would create an undesirable thermal insulation between cold sink 16 and thermoelectric devices 40. Thermal insulation severely degrades the heat transfer from cold sink 16 to thermoelectric devices 40. Additionally, leads in the center region or cold sink 16 area take up valuable chip area which is better allocated for the element to be cooled.

As depicted, all P and N thermoelectric devices 40 are interconnected in a series configuration with current source 36. P and N thermoelectric devices 40 are coupled "head to tail" in a serpentine configuration. An electrical conductor, such as electrical conductor 34, interconnects neighboring P and N thermoelectric devices 40. Neighboring P and N devices are connected on surfaces which are adjacent to hot source 14 and cold sink 16. Thermal switches 38 are depicted attached 10 between cold sink 16 and P and N thermoelectric devices 40.

Referring back to FIG. 4, a multidimensional layer cooling configuration provides superior performance. The radial configuration of two dimensional thermoelectric cooling configuration 50 can be placed on layers adjacent to the circuit to be cooled. For example, two dimensional thermoelectric cooling configuration 50 could be placed on layers above and below a temperature critical circuit.

Two dimensional thermoelectric cooling configuration 50 is easily constructed utilizing common practices and techniques of integrated circuit construction. The novel two dimensional configuration maximizes internal and external surface area. Hence, two dimensional thermoelectric cooling configuration 50 maximizes cooling concentration and surface area for heat dissipation. The radial configuration maximizes the amount of cooling which can be realized.

The outer circle of two concentric circles has an exponentially larger circumferential surface area than the surface area of the internal ring. Therefore, concentrated cooling and maximum surface area for heat dissipation is attained by the present invention.

Two dimensional thermoelectric cooling configuration 50 has many advantages over prior art designs. Two dimensional thermoelectric cooler configuration 50 requires no additional packaging apart from the packaging which contains functional circuitry. Prior art cooling configurations typically utilize a "piggyback" configuration which places the thermoelectric cooler on top of, or underneath an integrated circuit package to be cooled but not integrated therewith.

Thermoelectric coolers are ideally suited to many miniature cooling applications because they are compact, have no moving parts and are silent in operation. The thermoelectric cooling configuration of the present invention is less complicated and more rugged than other cooling solutions.

Figure 6:
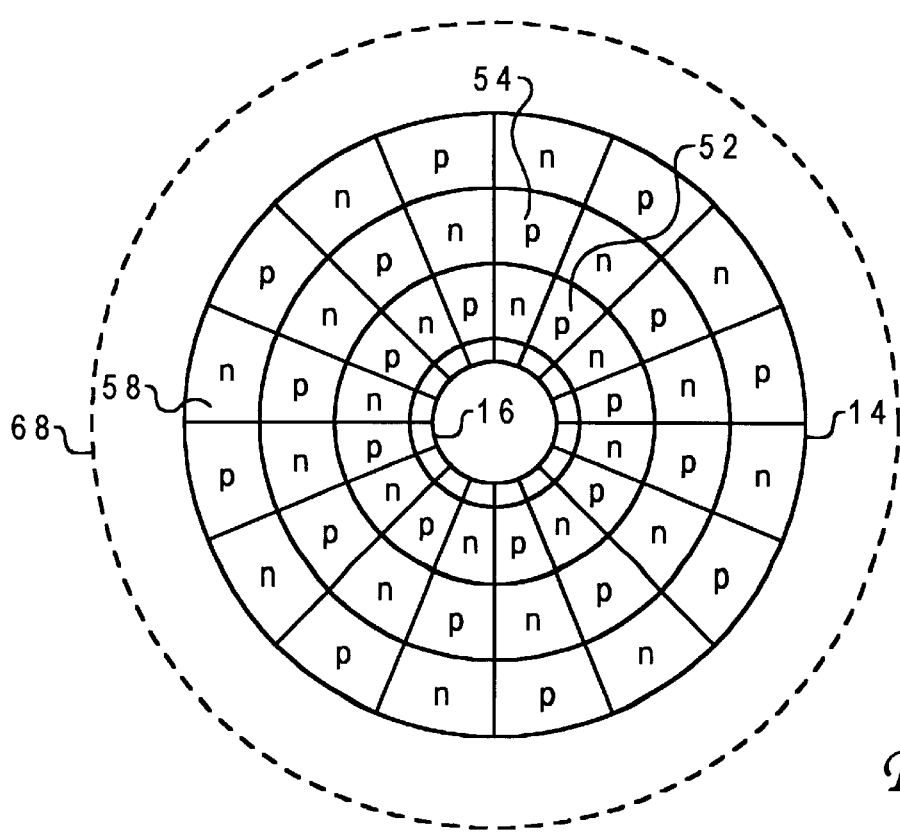
FIG. 6 illustrates a cascaded configuration of Peltier devices in accordance with the method and system of the present invention.

Referring now to FIG. 6, a cascaded thermoelectric cooler configuration is depicted. Cascade cooler 68 is comprised of three concentric thermoelectric cooling rings, inner ring 52, middle ring 54 and outer ring 58. Inner ring 52, middle ring 54 and outer ring 58 are identical in function to two dimensional thermoelectric cooling configuration 50 of FIG. 4. Middle ring 54 is placed concentric to inner ring 52. Outer ring 58 is placed concentric to middle ring 54. Three concentric rings are depicted, however, there is no practical limit to the number of rings which could be cascaded in order to produce a significant temperature gradient from hot source 14 to cold sink 16. Two dimensional thermoelectric cooling configuration 50 of FIG. 4 can be utilized in many applications. Critical circuits can be cooled or locations external to the thermoelectric coolers can be coupled to cool areas external to the integrated circuit.

A reduction in operating temperature considerably improves the performance of electronic devices. Additionally, transistor reliability is greatly improved because silicon junctions puncture easily when operated at high temperatures.

In a preferred embodiment of the present invention, the voltage supplied to the thermoelectric cooling system is on the order of a few millivolts while the current is on the order of one amp. Interconnecting conductors which carry one amp of current on an integrated circuit must be fabricated utilizing a thick layer of conducting material to reduce resistive heating. A thick conductor on the ends of N and P type devices act as a thermal insulator. Placement and construction of interconnecting conductors is critical.

A series interconnection for the delivery of power to thermoelectric elements is far superior to prior art designs. A parallel configuration of supply power to each P-type and N-type device would incur significant thermal inefficiencies. The inefficiencies result because a parallel interconnection requires each thermoelectric device to have power leads between cold sink 16 and inner ring 52. Conductors within this region create resistive heat and produce an insulative effect which severely degrade system performance and efficiency.

In the configuration of the present invention, the interconnection of the N-type and P-type thermoelectric devices at the heat source end can be made in the area adjacent to the P and N regions without the creation of thermal impedance in the space between thermoelectric element 20 and cold sink 16.

A preferred embodiment employs an outside diameter of inner ring 52 of 40 microns and an inner diameter of 20 microns. An area of 50 um×50 um allows 100,000 thermoelectric cooler configurations on a standard sized chip of 15 mm×15 mm can cool 100 w.

Figure 7:
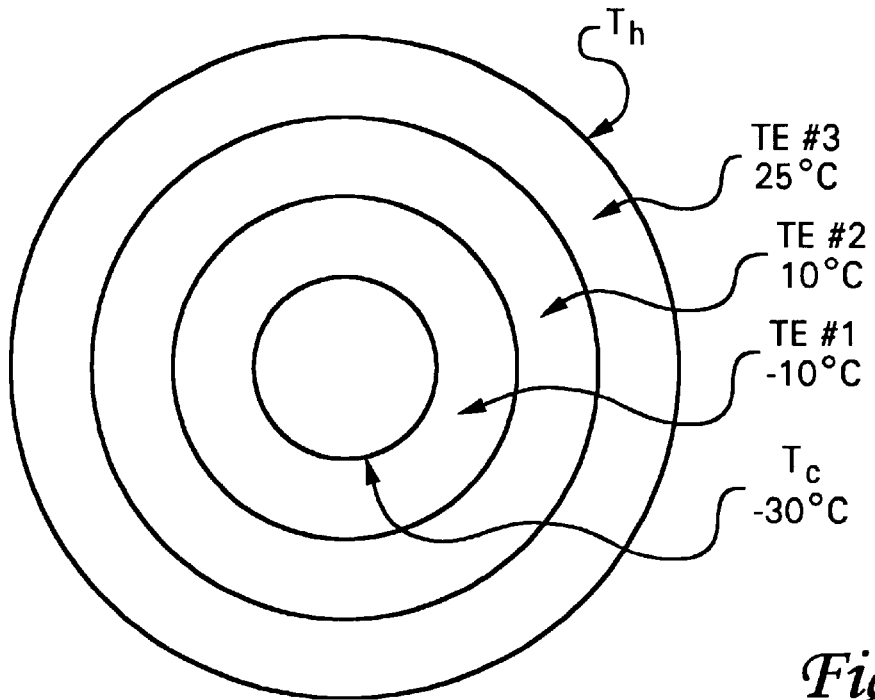
FIG. 7 depicts exemplary thermal gradients for the cascaded configuration of FIG. 6.

With reference now to FIG. 7, predicted thermal gradients for the cascaded thermoelectric coolers of FIG. 6 are illustrated. The thermal gradient diagram depicts approximately a 20° C. temperature differential in the smaller rings decreasing to a 15° C. differential in the outer rings. This occurs due to the non ideal heat transfer between rings. A design which minimizes the temperature gradient across each thermoelectric layer maximizes efficiency. The change in temperature across a thermoelectric ring or Peltier device dictates the efficiency of Peltier operation. For maximization of efficiency, a 20° C. difference in temperature across a ring is considered optimum.

The conductors which supply electrical power to thermoelectric devices and reside between cascaded thermoelectric rings create some impedance to heat flow outward from cold sink 16 of FIG. 6 and hamper dissipation. It is preferred to select an electrical conductor which also has good thermal conduction qualities.

Figure 8:
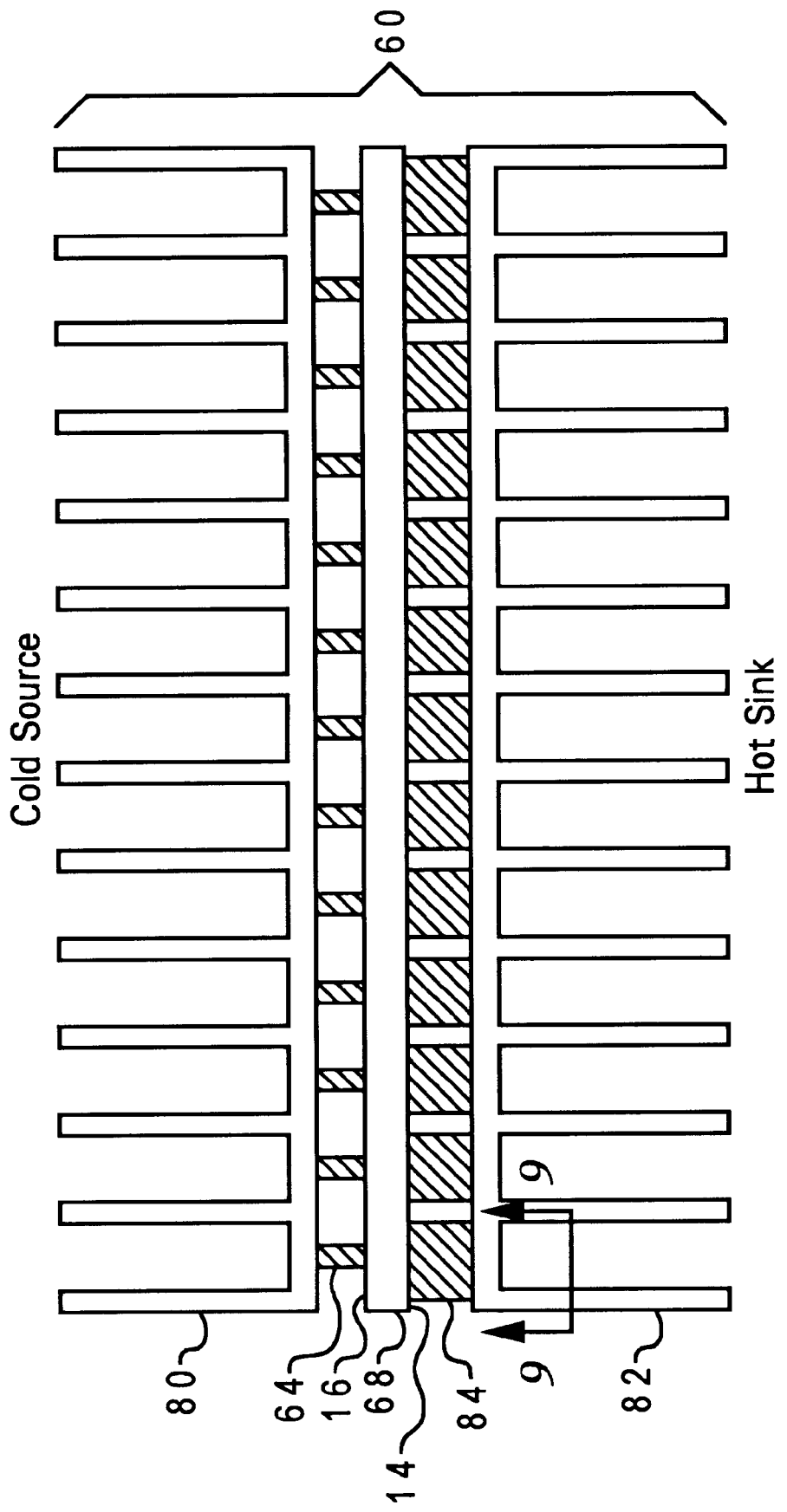
FIG. 8 illustrates an array of cascaded cooler configurations coupled to heat transfer hardware in accordance with the method and system of the present invention.

Referring now to FIG. 8, supporting hardware for utilizing an array of two-dimensional thermoelectric cooling devices in an external cooling configuration is depicted. Cooling structure 60 transfers heat from cold exchanger 80 to hot exchanger 82. Substrate 68 contains an array of cascaded two dimensional thermoelectric cooling units. The operation of two dimensional cooling units were discussed in FIG. 6. The center of each cascaded thermoelectric cooling unit or cold sink 16 is thermally coupled to cold exchanger 80 and the circumference of the outer ring or hot source 14 is coupled to hot exchanger 82. The center cold sink of each thermoelectric cooler is coupled to cold exchanger 80 via post 64 and the outermost circumference of each thermoelectric cooling element or the hot source 14 is coupled to hot exchanger 82 via tubular structure 84.

The rate of heat exchange provided by cold exchanger 80 can be enhanced by moving air across cold exchanger 80. Likewise, the effectiveness of hot exchanger 82 can be enhanced by utilizing fans to move air across its surface.

Figure 9:
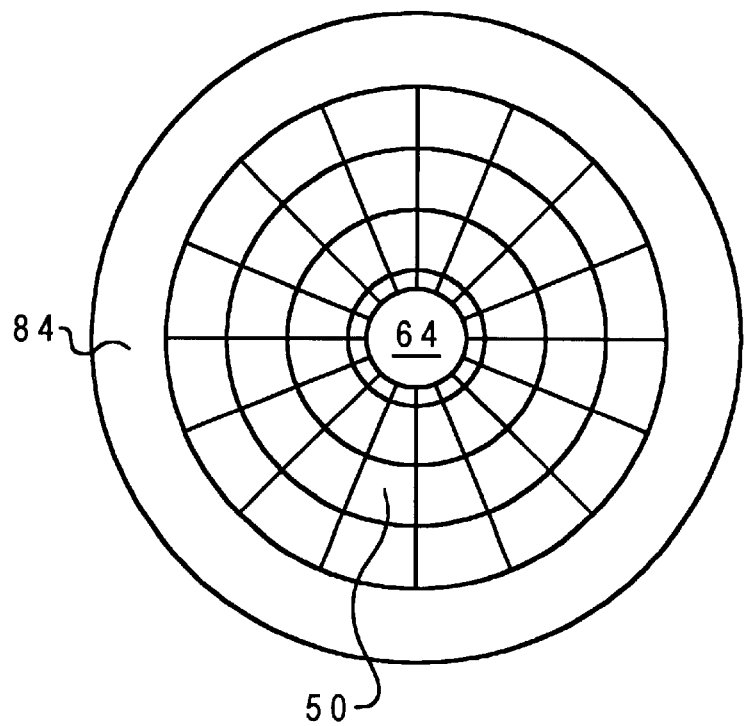
FIG. 9 depicts a cross sectional view of a single thermoelectric cooler cell from the array of FIG. 8 in accordance with the method and system of the present invention.

With reference to FIG. 9, a cross sectional view of area A—A in FIG. 8 is depicted. Post 64 is surrounded by two dimensional thermoelectric cooling configuration 50. Two dimensional thermoelectric cooling configuration 50 is surrounded by tubular structure 84. Hence, post 64 thermally couples cold sink 16 of FIG. 4 to cold exchanger 80 and tubular structure 84 couples hot source 14 of FIG. 4 to heat exchanger 82 on a large scale. This configuration could be utilized for refrigeration or air conditioning. A thermoelectric cooler is not limited by low temperatures which freeze the cooling fluid in a vapor compression system. Much cooler temperatures are attainable by thermoelectric cooling than a traditional vapor compression system.

While the invention has been particularly shown and described with reference to a preferred embodiment, it will be understood by those skilled in the art that various changes in form and detail may be made therein without departing from the spirit and scope of the invention.

What is claimed is:

1. A system for efficiently transferring heat from a thermal source to a thermal sink utilizing thermoelectric cooling effects, said system comprising:

a power source;

a hot source on an integrated circuit having a surface area;

a cold sink on said integrated circuit having a surface area;

a plurality of thermoelectric elements on said integrated circuit electrically coupled in a series configuration with said power source and thermally coupled in a parallel configuration with said surface area of said cold sink and said surface area of said hot source, wherein said surface area of said hot source is greater than said surface area of said cold sink;

a thermal switch coupling said thermoelectric elements to said cold sink; and means for intermittently pulsing said thermal switch such that a net thermoelectric energy transfer flows into said cold sink.

2. The system for thermoelectric cooling as in claim 1 wherein said plurality of thermoelectric elements are arranged in a radial configuration.

3. The system for thermoelectric cooling as in claim 1 wherein said plurality of thermoelectric elements have alternating polarities.

4. The system for thermoelectric cooling as in claim 1 wherein said plurality of thermoelectric elements are electrically interconnected in a serpentine configuration.

5. The system for thermoelectric cooling as in claim 1 wherein a second plurality of thermoelectric elements are coupled between said first plurality of thermoelectric elements and said heat source to lower an operating temperature of said first plurality of thermoelectric elements.

6. The system for thermoelectric cooling as in claim 1 wherein said cold sink is coupled to a heat sensor.

7. The system for thermoelectric cooling as in claim 1 wherein said integrated circuit is surrounded by an ambient temperature, and said cold sink has a lower temperature than the ambient temperature.

8. The system for thermoelectric cooling as in claim 1 wherein said cold sink is coupled to an external convection apparatus.

9. The system for thermoelectric cooling as in claim 1 wherein said hot source is coupled to said integrated circuit utilizing a thermally conductive media.

10. The system for thermoelectric cooling as in claim 1 wherein said cold sink is cooled by said plurality of thermoelectric elements and said hot source is heated by said plurality of thermoelectric elements.

11. The system for thermoelectric cooling as in claim 1 wherein said heat source is coupled to an external convection apparatus.

12. The system for thermoelectric cooling as in claim 1 wherein said power source provides pulsed power to said thermoelectric devices.

13. The system for thermoelectric cooling as in claim 4 wherein said plurality of thermoelectric elements in said series configuration are comprised of alternating P-type devices and N-type devices.

14. The system for thermoelectric cooling as in claim 1 wherein said power source provides pulsed power which is synchronized with said intermittent pulsing of said thermal switch.

15. The system for thermoelectric cooling as in claim 1 wherein said plurality of thermoelectric devices are Peltier devices.

16. A method for uniformly and efficiently transferring heat from a thermal source to a thermal sink comprising the steps of:

surrounding a thermal source utilizing thermoelectric elements;

coupling said thermoelectric elements to a thermal sink using a thermal switch;

intermittently pulsing said thermal switch to move heat from said thermal source to said thermal sink;

supplying power to said thermoelectric elements with a duty cycle selected to avoid a net decrease of heat transfer through said thermoelectric elements; and dissipating heat from said thermal source to provide uniform and efficient transfer of heat from said thermal source to said thermal sink.

17. The method as in claim 16, further comprising the step of cooling said thermal sink with cascaded thermoelectric devices.

18. The method as in claim 16, further comprising the step of cascading additional thermoelectric devices with said utilized thermoelectric devices.

19. The method as in claim 16, wherein the step of surrounding is further comprised of surrounding utilizing a radial serpentine configuration of thermoelectric devices.

20. The method as in claim 16, wherein the step of surrounding includes the step of electrically coupling said thermoelectric elements in a series configuration with a power source.

21. The method as in claim 16, wherein the step of supplying power is synchronized with said intermittent pulsing of said thermal switch.

* * * * *